(12) United States Patent
Park

(10) Patent No.: US 6,861,369 B2
(45) Date of Patent: Mar. 1, 2005

(54) METHOD OF FORMING SILICIDATION BLOCKING LAYER

(75) Inventor: Jung-Hoon Park, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/142,496

(22) Filed: May 10, 2002

(65) Prior Publication Data

US 2002/0168851 A1 Nov. 14, 2002

(30) Foreign Application Priority Data

May 10, 2001 (KR) ......................... 2001-25552

(51) Int. Cl.⁷ ............................................. H01L 21/302
(52) U.S. Cl. ..................... 438/745; 438/750; 438/751; 216/103; 216/106
(58) Field of Search ............................... 438/745, 750, 438/751, 752; 134/1.1, 1.2, 1.3; 216/103, 104, 106

(56) References Cited

U.S. PATENT DOCUMENTS 6,348,389 B1 * 2/2002 Chou et al. ................. 438/305
6,348,693 B1 * 2/2002 Weisfield et al. ......... 250/370.11
6,391,794 B1 * 5/2002 Chen et al. ................. 438/745
6,498,080 B1 * 12/2002 Chittipeddi et al. ........ 438/305

* cited by examiner

Primary Examiner—Lan Vinh
(74) Attorney, Agent, or Firm—Marger Johnson & McCollom, P.C.

(57) ABSTRACT

Disclosed is a method of manufacturing a semiconductor device. First, a silicidation blocking layer is formed on a semiconductor substrate by a plasma enhanced chemical vapor deposition process. Next, the silicidation blocking layer in a region in which a metal silicide contact is to be formed is removed by a wet etching process. Next, after a metal layer is formed on the resultant, the silicon in the region and the metal of the metal layer are reacted to form the metal silicide. Since the silicidation blocking layer consisting of PE-SiON is formed at a low temperature of less than 400 Celsius Degrees, it is possible to prevent diffusion and redistribution of impurities in gate and source/drain regions of a transistor during the deposition of the silicidation blocking layer.

16 Claims, 9 Drawing Sheets

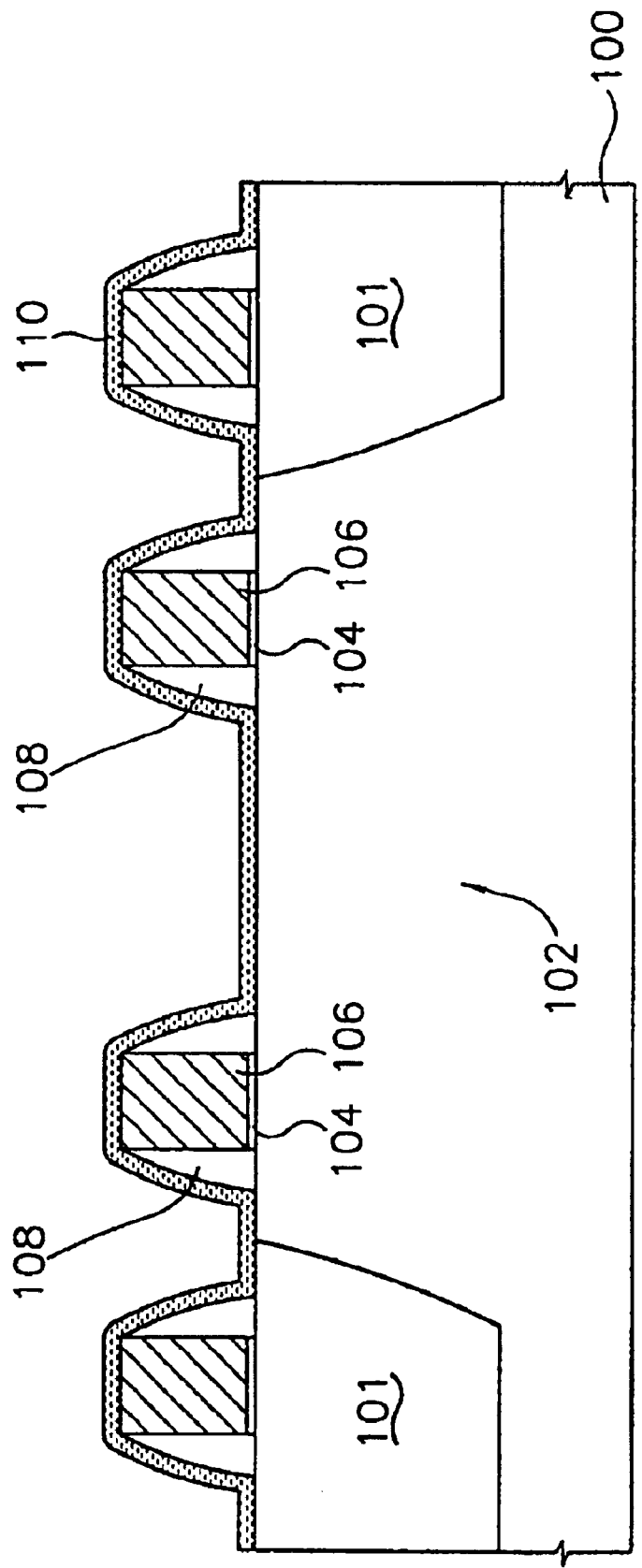

METHOD OF FORMING SILICIDATION BLOCKING LAYER

BACKGROUND OF THE INVENTION

1. Field of the Invention

The present invention relates to a method of manufacturing a semiconductor device, and more particularly, to a method of manufacturing a semiconductor device, which can accomplish the selective silicidation of a desired region on a semiconductor substrate.

2. Description of the Related Art

As a semiconductor device has been developed to have a high degree of integration, patterns formed on a chip become smaller in size and the gap between the patterns becomes narrower. In the past, polysilicon has been a very useful material as a wiring material such as a gate electrode or a bit line. However, as patterns are gradually smaller, the resistivity of the polysilicon becomes higher, resulting in increasing RC time delays and IR voltage drops. In order to improve short channel and punchthrough effects caused by a decrease of a gate length of the transistor, the junction depths of source/drain regions should be thinner while parasitic resistances of the source/drain regions, e.g., a sheet resistance and a contact resistance, need to be reduced.

Accordingly, a self-aligned silicide (hereinafter, referred to as a salicide) process of forming silicides on the surface of the gate region and the source/drain regions is used as a new metalization process capable of reducing the resistivity of the gate electrode and the parasitic resistances of the source/drain regions. The salicide process selectively forms the silicides only on the gate electrode and the source/drain regions. The silicide is formed by using a material such as titanium silicide ($TiSi_2$) or the group-VIII silicides such as $PtSi_2$, $PdSi_2$, $CoSi_2$ and $NiSi_2$. In the semiconductor device having a design rule of about 0.25 $\mu$m, it is preferred to use the cobalt silicide of which the dependence to a critical dimension of the gate is low. It is known that the cobalt silicide has a low resistivity of 16~18 $\mu\Omega$-cm and a stable characteristic at high temperatures of about 900 Celsius Degrees.

In case of a logic device using the cobalt silicide as the material of the gate electrode, the silicide formation is excluded in an analog region since the gate is used as the resistance element in the analog region. Accordingly, in order to selectively form the silicide on the desired region, before a metal layer for silicide is deposited, there is formed a silicidation blocking layer (SBL) consisting of a material that is not reactive to the metal layer.

FIGS. 1A to 1C are sectional views illustrating a conventional method of manufacturing a logic device having the silicidation blocking layer.

Referring to FIG. 1A, a field oxide layer 11 is formed on a semiconductor substrate 10 by a conventional shallow trench isolation process, thereby defining an active region 12 on the substrate 10. Next, after a gate oxide layer 14 is formed on the active region 12 of the substrate 10, a polysilicon layer is deposited on the gate oxide layer 14. The polysilicon layer is doped with a high concentrated N-typed dopant by a doping process, e.g., $POCL_3$ diffusion, ion implantation, or in-situ doping. Then, the polysilicon layer is patterned by a photolithography process to form $N^+$ typed gate electrodes 16.

After an insulation material such as silicon oxide or silicon nitride is deposited on the gate electrodes 16 and the substrate 10 by a chemical vapor deposition (CVD) process, the insulation layer is anisotropically etched away to form gate spacers 18 on the sidewalls of the gate electrodes 16. Then, source and drain regions are formed in the surface of the substrate on both sides of the gate electrode 16 by an ion implantation process. As a result of the above-described process, MOS transistors including the gate electrode 16 and the source/drain regions are completed.

Next, an oxide is deposited at a temperature of about 750 Celsius Degrees on the MOS transistors and the substrate 10 by a CVD process to form a buffer layer 20 having a thickness of about 50~100 Å. Silicon nitride is deposited at the temperature of about 670 Celsius Degrees on the buffer layer 20 by a low pressure chemical vapor deposition (LPCVD) process to form a silicidation blocking layer 22 having a thickness of about 100~200 Å. The buffer layer 20 prevents an attack of the silicon substrate 10 and the field oxide layer 11 located thereunder during a subsequent etching process of the silicidation blocking layer 22.

Referring to FIG. 1B, a photoresist pattern 24 is formed on the silicidation blocking layer 22 by a photo process, to thereby expose a region where silicide is to be formed. Then, the silicidation blocking layer 22 in the region in which the silicide is to be formed is dry-etched by using the photoresist pattern 24 as a mask. As a result, there is formed the silicidation blocking layer pattern (hereinafter, referred to as a SBL pattern) 22a defining an activation region and a non-activation region of the silicidation.

Referring to FIG. 1C, the photoresist pattern 24 is removed by ashing and stripping processes. Next, a wafer is put in a chamber of RF sputtering equipment after a typical wet cleaning process is performed to remove particles, metal impurities, organic contaminants or a native oxide created on surfaces of the silicon layer and the polysilicon layer.

Then, after a RF plasma etching is carried out in order to remove the native oxide to be re-created during movement of the wafer, a cobalt layer is in-situ deposited on the wafer by a sputtering process. A rapid thermal annealing or a heat treatment using a furnace is performed twice to form the cobalt suicides 26 only in the exposed gate region and/or active region. At that time, no silicide is formed in the gate region and/or the active region covered by the SBL pattern 22a.

According to the conventional method, since the silicidation blocking layer is deposited after the gate and the source/drain regions are formed, a heat budget at 750 Celsius Degrees/670 Celsius Degrees causes the impurities doped in the gate and the source/drain regions to be diffused and redistributed. As a result, a short channel effect such as a punch-through between the source/drain regions is generated or the impurities in the gate electrode penetrate through the gate oxide into the channel region.

SUMMARY OF THE INVENTION

The present invention has been made to solve the aforementioned problem, and accordingly it is an object of the present invention to provide a method of manufacturing a semiconductor device in which a silicidation blocking layer is deposited at a low temperature to prevent the diffusion of impurities in gate and source/drain regions.

In order to achieve the object of the present invention, according to the first embodiment of the present invention, there is provided a method of manufacturing a semiconductor device comprising the steps of: forming a silicidation blocking layer on a semiconductor substrate by a plasma-enhanced CVD (PE-CVD) process; removing the silicidation blocking layer of a region by a wet etching process, in which a metal silicide contact is formed; forming a metal layer on the region and the substrate; and inducing a silicide reaction of silicon in the region with metal of the metal layer to form a metal silicide.

According to the second embodiment of the present invention, there is provided a method of manufacturing a semiconductor device comprising the steps of: forming transistors having gate electrodes and source/drain regions on an active region of a semiconductor substrate; forming a silicidation blocking layer on the transistors and the substrate by a PE-CVD process; removing the silicidation blocking layer in a partial region of the substrate by a wet etching process to form a silicidation blocking layer pattern; forming a metal layer on the silicidation blocking layer pattern, the transistors and the substrate; and inducing a silicide reaction of silicon in the partial region of the substrate, in which the silicidation blocking layer pattern is not formed, and metal of the metal layer, to thereby form a metal silicide.

According to the present invention, silicon oxynitride (SiON) is deposited at the temperature of less than 400 Celsius Degrees by the PE-CVD process to form the silicidation blocking layer. Accordingly, it is possible to prevent the diffusion and redistribution of impurities in gate and source/drain regions of the transistor during the deposition of the silicidation blocking layer.

BRIEF DESCRIPTION OF THE DRAWINGS

The above and other objects and advantages of the present invention will become readily apparent by reference to the following detailed description when considered in conjunction with the accompanying drawings wherein:

FIGS. 2A to 2E are sectional views illustrating a method of manufacturing a logic device having a silicidation blocking layer according to one embodiment of the present invention.

DETAILED DESCRIPTION OF THE PREFERRED EMBODIMENT

Hereinafter, the preferred embodiments of the present invention will be described in detail with reference to the accompanying drawings.

FIGS. 2A to 2E are sectional views of illustrating a method of manufacturing a logic device having a silicidation blocking layer according to one embodiment of the present invention.

Figure 1A:
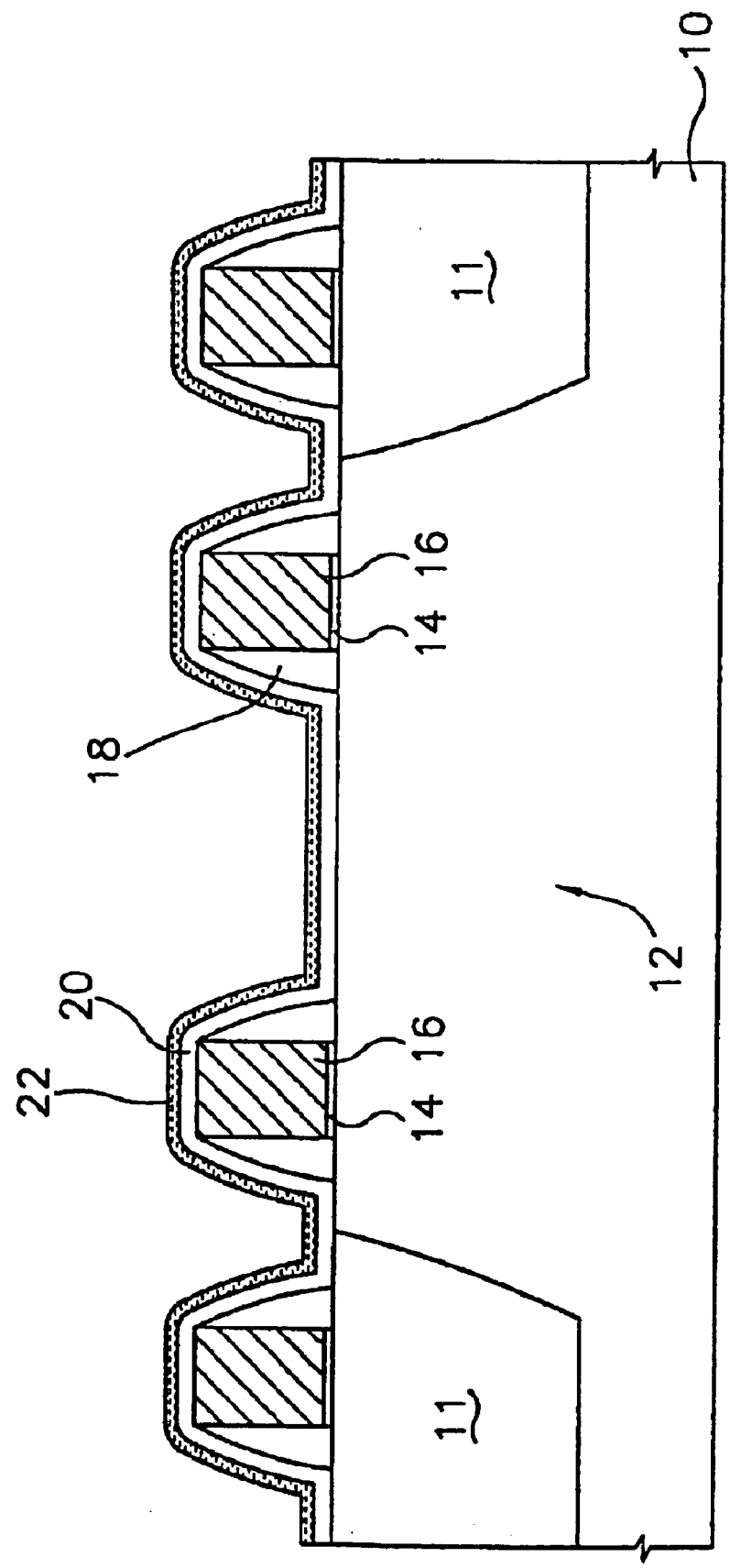
FIGS. 1A to 1C are sectional views illustrating a conventional method of manufacturing a logic device having a silicidation blocking layer.
Figure 1B:
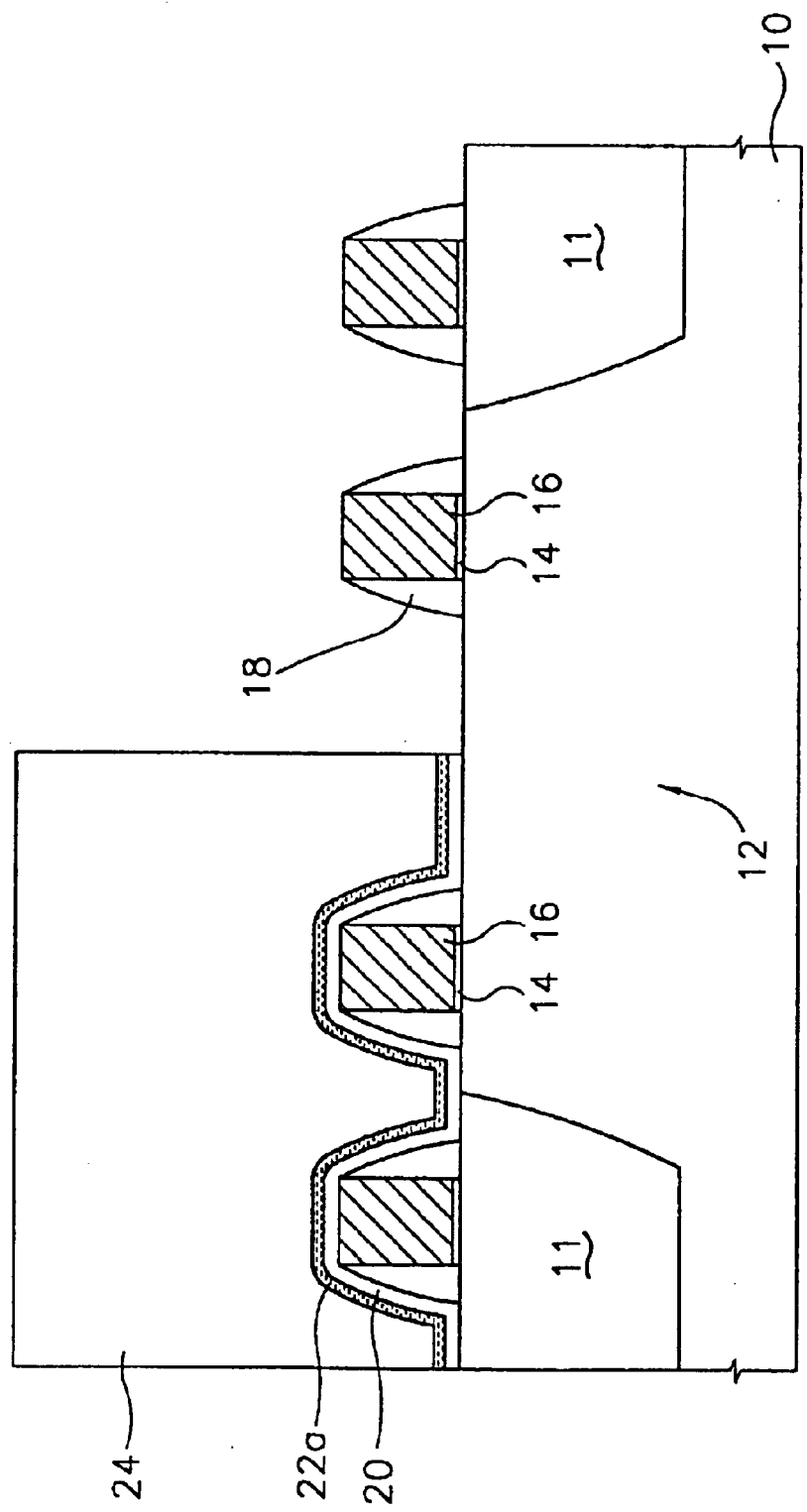
Figure 1C:
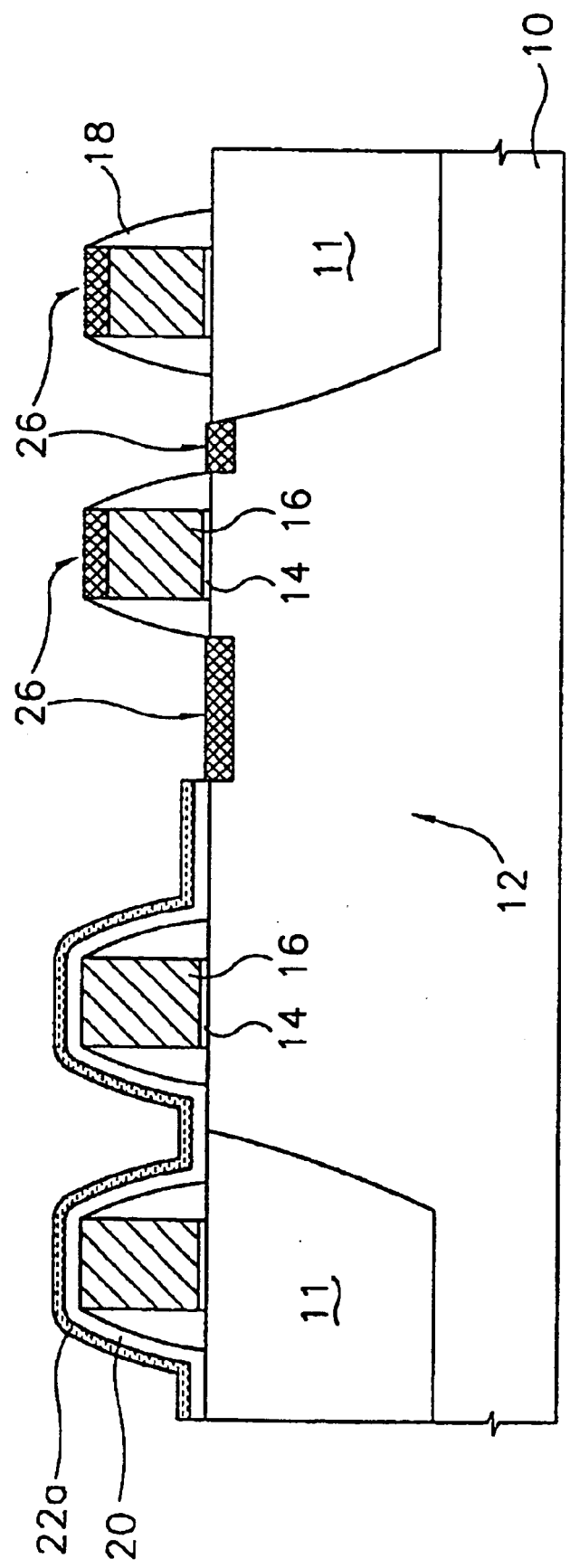
Figure 2A:
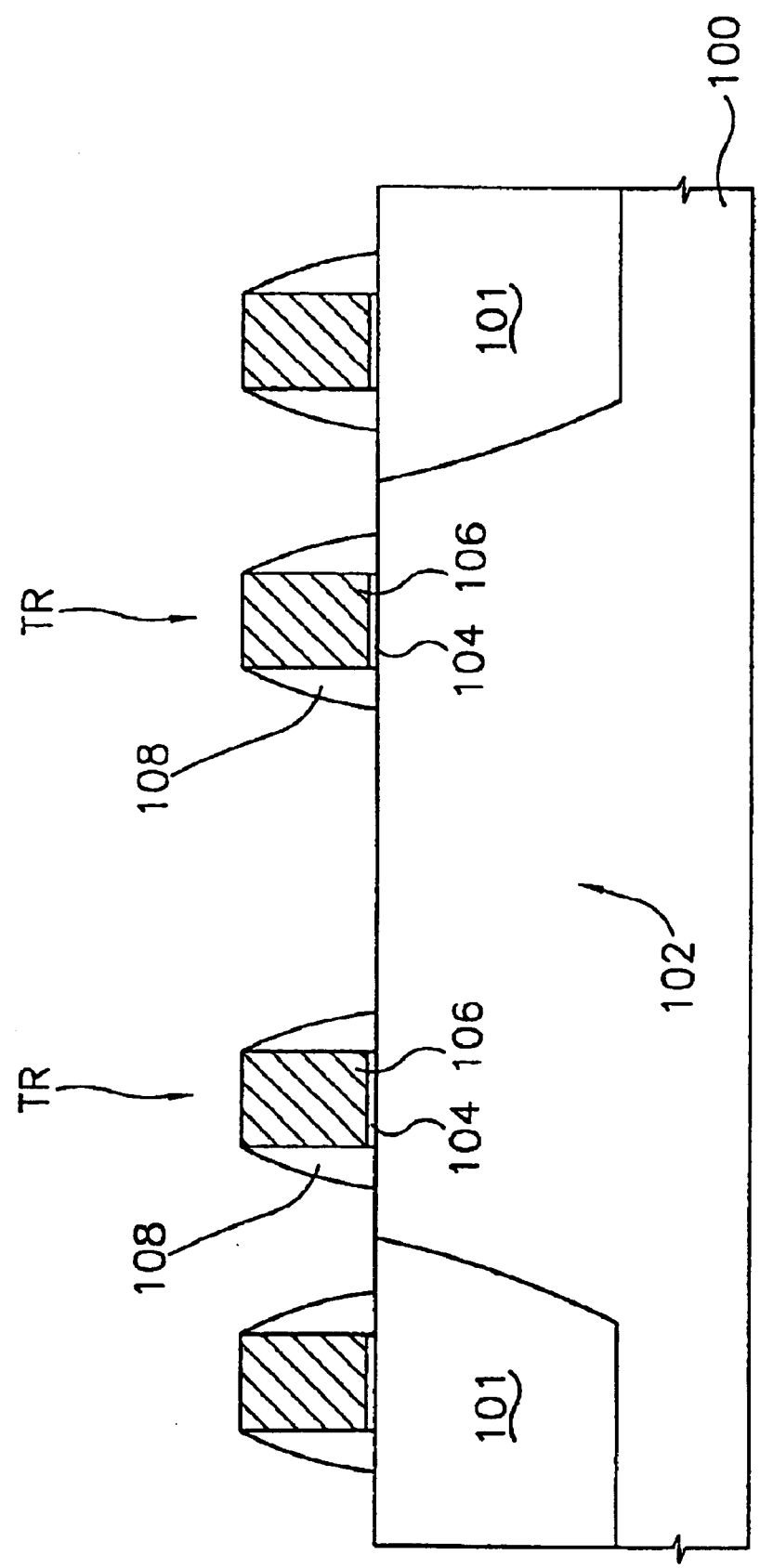

FIG. 2A shows a step of forming MOS transistors. First, a semiconductor substrate 100 such as a silicon substrate is prepared. Next, a field oxide layer 101 is formed on the substrate 100 by a conventional shallow trench isolation process to thereby define an active region 102 on the substrate 100.

Next, a gate oxide layer 104 comprising silicon oxide ($SiO_2$) or silicon oxynitride (SiON) is formed to a thickness of about 60~80 Å on the surface of the substrate 100 in the active region 102 enclosed by the field oxide layer 101. A polysilicon layer is deposited to a thickness of about 2000~2500 Å on the gate oxide layer 104 by a low-pressure chemical vapor deposition (LPCVD) process. The polysilicon layer is doped with a high concentrated N-typed dopant by a doping process, for example $POCL_3$ diffusion, ion implantation or in-situ doping and is then patterned by a photolithography process to form $N^+$ typed gate electrodes 106.

An insulation film is deposited to a thickness of about 800 Å on the entire surface of the substrate 100 by a chemical vapor deposition (CVD) process. The insulation film is anisotropically etched away to form gate spacers 108 on the sidewalls of the gate electrodes 106. Preferably, the gate spacer 108 comprises a material, e.g., a nitride or an oxide, capable of preventing a silicide reaction during a subsequent process.

Then, high concentrated source and drain regions are formed at the surface portions of the substrate on both sides of the gate electrode 106 by an ion implantation process. As a result of the above-described process, MOS transistors including the gate electrode 106 and the source/drain regions are completed.

FIG. 2B shows a step of forming a silicidation blocking layer 110. Silicon oxynitride (SiON) is deposited to a thickness of about 300~1000 Å, preferably about 800 Å, on the MOS transistors and the substrate 100 at temperature of less than about 400 Celsius Degrees by a plasma enhanced chemical vapor deposition (PE-CVD) process using silane ($SiH_4$) and ammonium ($NH_4$) as source gases, thereby forming the silicidation blocking layer 110. $Si_2H_6$, $SiH_2Cl_2$, or $SiHCl_3$ instead of $SiH_4$ may be used as a silicon source gas, within the spirit and scope of the invention. Furthermore, silicon nitride (SiN) can be used instead of the silicon oxynitride (SiON), also within the spirit and scope of the invention. However, the silicon oxynitride (SiON) is preferably used in view of an etch selectivity with respect to an oxide.

The silicidation blocking layer 110 must be formed to a desired thickness enough to restrain the silicide reaction in consideration of the consumption of the silicidation blocking layer during a subsequent cleaning process that is carried out before a deposition of a metal layer.

In the conventional method, silicon nitride (SiN) is deposited at a high temperature of about 650~750 Celsius Degrees by the LPCVD process to form the silicidation blocking layer. Accordingly, impurities in the gate and source/drain regions are diffused and redistributed during the deposition of the silicidation blocking layer, resulting in deteriorating a characteristic of the transistor. On the contrary, according to the present invention, the silicon oxynitride (SiON) is deposited at a low temperature of less than about 400 Celsius Degrees by the PE-CVD process to form the silicidation blocking layer. Thus, the diffusion of the impurities in the gate and source/drain regions can be prevented.

Figure 2C:
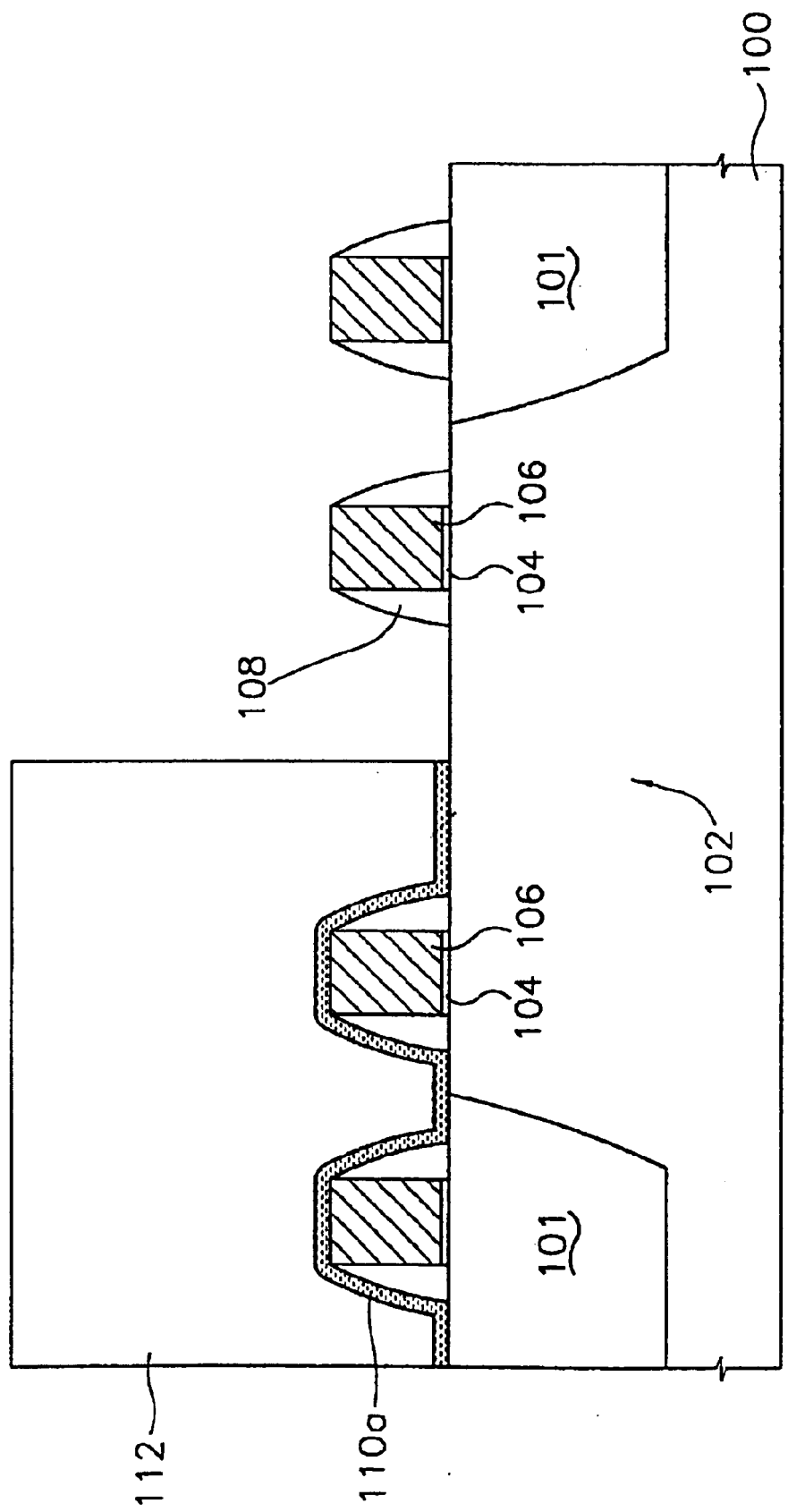

FIG. 2C shows a step of forming a silicidation blocking layer pattern 110a. After a photoresist film is coated on the silicidation blocking layer 110, the photoresist film is exposed and developed to form a photoresist pattern 112 for opening a partial region in which a silicide is to be formed. At that time, the partial region may be the gate region or the source/drain regions. Alternatively, the partial region may include all of the gate region and the source/drain regions of the transistor.

Next, using the photoresist film 112 as an etching mask, the exposed silicidation layer 110 is removed by a wet etching process. As a result, there is formed the silicidation blocking layer pattern 110a defining an activation region and a non-activation region of the silicidation.

At that time, in order to minimize the consumption of the field oxide layer 101, an etchant is used so that the silicon oxynitride has a high etch selectivity with respect to an oxide. Preferably, the silicidation blocking layer 110 is wet-etched away by using a chemical in which hydrogen fluoride (HF), hydrogen peroxide ($H_2O_2$) and DI water are mixed in a ratio of about 1:70:30. An etch rate of the PE-SiON with respect to the chemical is about 600~700 Å/min and an etch rate of the oxide is about 50 Å/min. That is, when the etchant is used so that the PE-SiON has the etch selectivity of no less than about 10:1 with respect to the oxide is used, the silicidation blocking layer 110 can be patterned while minimizing the consumption of the field oxide layer 101.

According to the conventional method, since the silicidation blocking layer consisting of LP-SiN is patterned by the dry etching process, a buffer layer consisting of an oxide is formed under the silicidation blocking layer in order to restrain the consumption of the field oxide layer and to reduce any etching damage. On the contrary, according to the present invention, it is not necessary to form the buffer layer under the silicidation blocking layer since the silicidation blocking layer consisting of PE-SiON is patterned by the wet etching process.

Further, in this embodiment of the present invention, the photoresist pattern is used as a mask for wet-etching the silicidation blocking layer. However, a hard mask such as a silicon oxide may be used for wet-etching the silicidation blocking layer, within the spirit and scope of the invention.

Figure 2D:
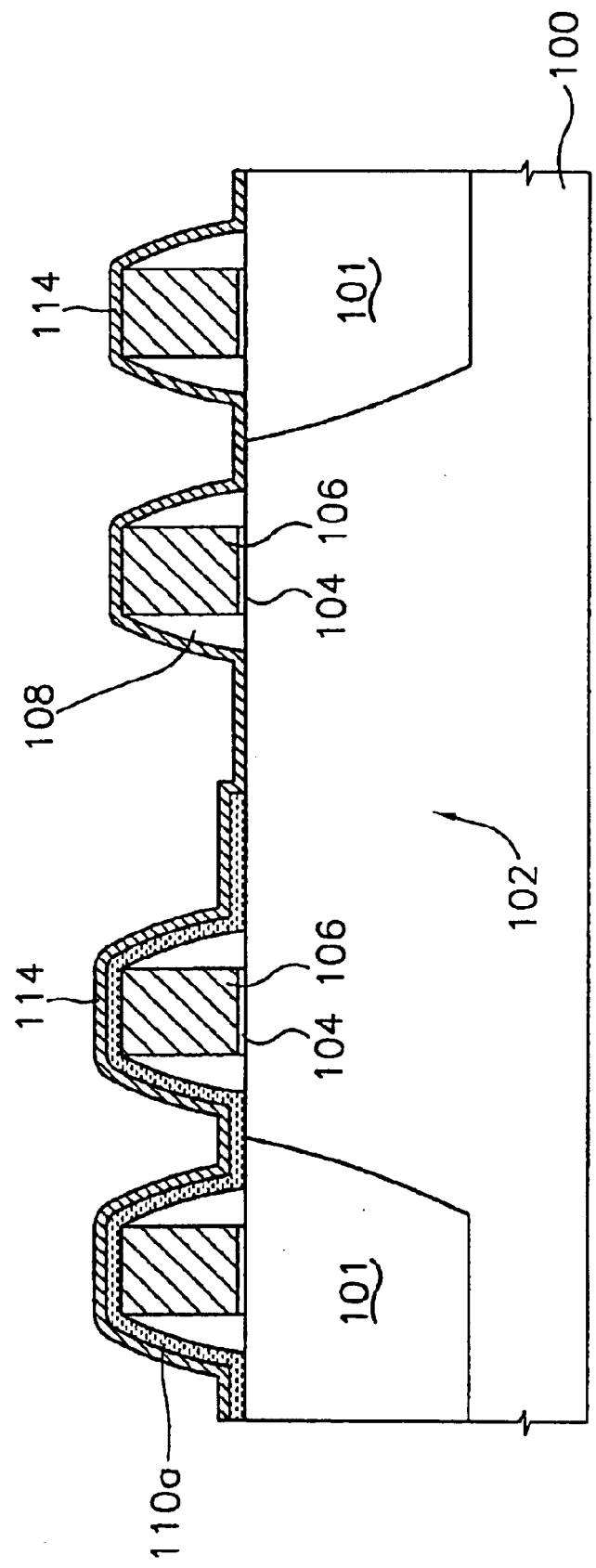

FIG. 2D shows a step of forming a metal layer 114. After the silicidation blocking layer pattern 110a is formed as described above, the photoresist pattern 112 is removed by ashing and stripping processes.

Then, after a typical wet cleaning process is performed in order to remove contaminants including particles on the substrate 100 or native oxide formed on the surface of the silicon region, the substrate 100 is placed in a chamber of a RF sputtering equipment. After the RF plasma etching is performed in order to remove the native oxide that may be re-created during movement of the substrate 100, the metal layer 114, e.g., a cobalt layer, is in-situ deposited by sputtering on the entire surface of the substrate 100.

Figure 2E:
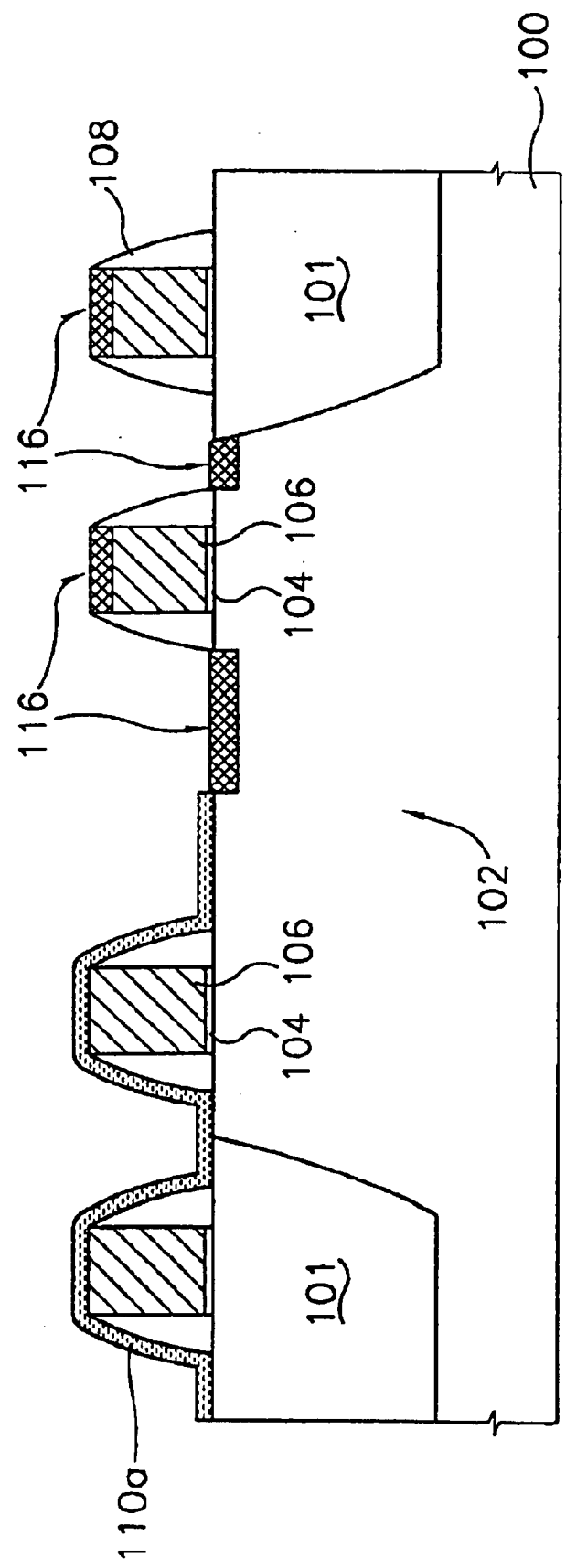

FIG. 2E shows a step of forming a metal silicide 116. After the substrate 100 is placed in a reaction chamber of a typical high speed heater, the substrate 100 is first heated at a temperature of about 400~600 Celsius Degrees under an N2 ambient, to thereby induce the silicide reaction on regions in which the metal layer 114 is in contact with the silicon. As a result, first-phase metal silicides, e.g., cobalt monosilicides (CoSi), are formed in the gate electrodes 106 and the source/drain regions of the regions in which the SBL pattern 110a is not formed. On the contrary, no silicide is formed on the gate spacers 108 and the region covered with the SBL pattern 110a.

Next, the unreacted metal layer 114 is selectively removed through the use of an etchant that does not attack the metal silicide, the semiconductor substrate 100 and the gate oxide layer 104. Continuously, after the substrate 100 is placed in the high speed heating chamber, the second heating process of the substrate 100 is carried out at the high temperature of about 700~900 Celsius Degrees under the nitrogen ambient. As a result, the first-phase metal silicide is converted into a second-phase metal silicide to form the perfect metal silicide 116. For example, when the cobalt layer is formed to a thickness of 100 Å, the cobalt monosilicide (CoSi) having a thickness of about 200 Å is formed in the first heating process and the cobalt disilicide ($CoSi_2$) having a thickness of about 400 Å is formed in the second heating process.

Here, a capping layer consisting of titanium (Ti) and titanium nitride (TiN) may be formed on the metal layer 114 before carrying out the first heating process. The capping layer prevents the oxidation of the metal and the excess growing of the metal silicide into the undesired region.

Figure 3:
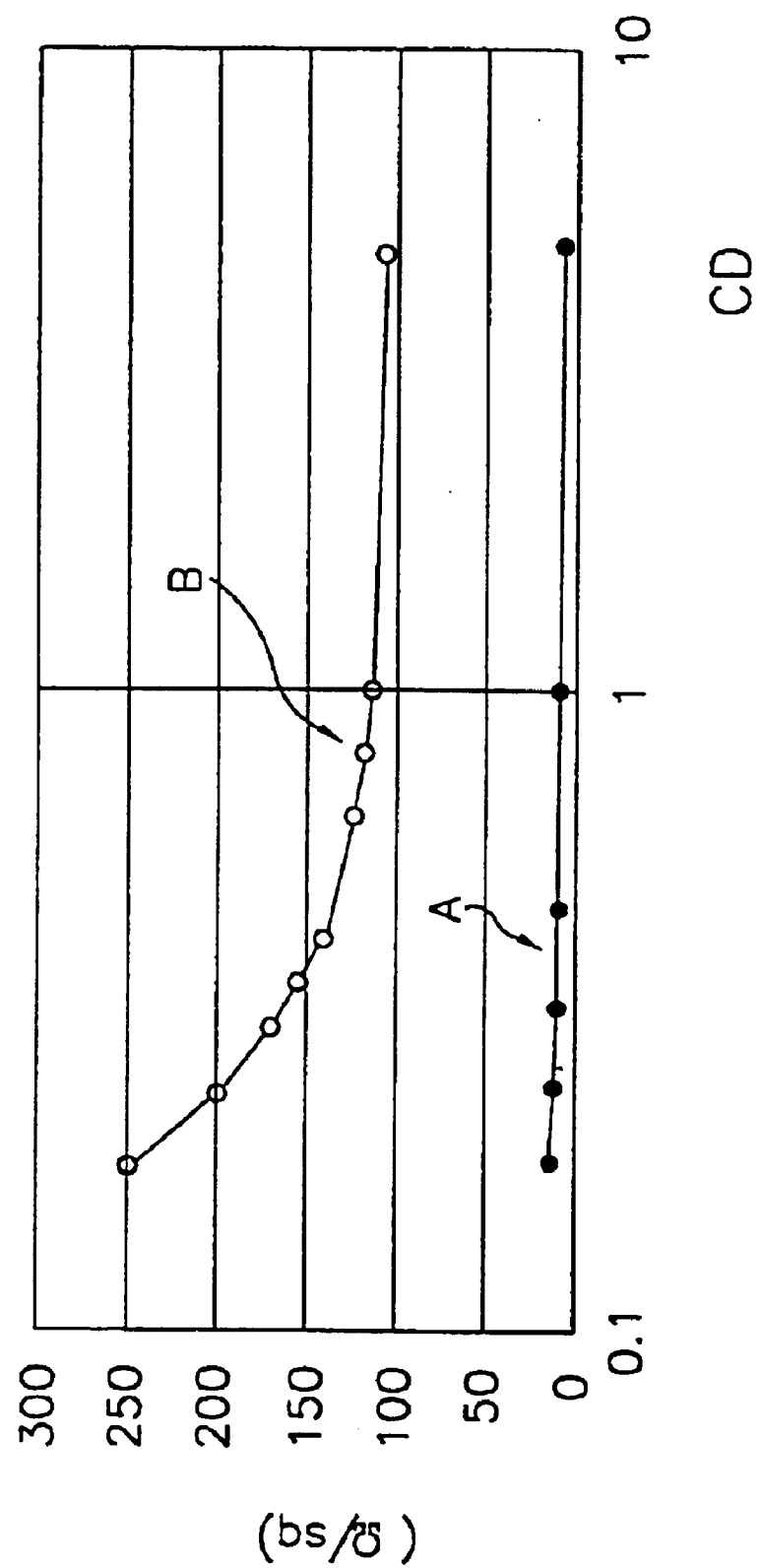
FIG. 3 is a graph showing results that a sheet resistance of a gate electrode is measured according to the present invention.

FIG. 3 is a graph showing sheet resistance of the gate electrode as measured according to the present invention. Here, the X axis indicates the critical dimension of the gate electrode and the Y axis indicates a sheet resistance of the gate electrode.

Referring to FIG. 3, after the PE-SiON was deposited to a thickness of about 800 Å to form the silicidation blocking layer, the silicidation blocking layer was patterned by a wet etching process using the mixture of the hydrogen fluoride (HF), the hydrogen peroxide ($H_2O_2$) and the DI water for about one hundred seconds. Then, the sheet resistance of the $N^+$ gate electrode was measured in this state.

As a result, low constant sheet resistance could be maintained even though the critical dimension of the gate electrode was reduced due to the formation of the silicide in the SBL open region A that no SBL pattern was formed. Further, in the region B that the SBL pattern was formed, the sheet resistance of the gate electrode increases as the critical dimension of the gate electrode decreases. Accordingly, it can be noted that the PE-SiON sufficiently restrains the silicide reaction.

According to the present invention as described above, the silicon oxynitride is deposited at the low temperature of about 400 Celsius Degrees by the PE-CVD process to form the silicidation blocking layer. Therefore, the heat budget is reduced to restrain the diffusion and redistribution of the impurities in the gate and source/drain regions of the transistor during the deposition of the silicidation blocking layer.

Furthermore, since the silicidation blocking layer is patterned by the wet etching process, it is possible to minimize the consumption of the field oxide layer even though the buffer layer is not formed. Accordingly, a simplification of the processes can be obtained.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of manufacturing a semiconductor device comprising:
    forming a silicidation blocking layer on a semiconductor substrate by a plasma enhanced chemical vapor deposition process;
    wet-etching the silicidation blocking layer with an etchant that includes hydrogen fluoride and hydrogen peroxide to form a silicidation blocking layer pattern that exposes a region where a metal silicide contact is formed;
    forming a metal layer on the region and the semiconductor substrate; and
    inducing a silicide reaction of silicon in the region and of metal in the metal layer to form a metal silicide.

2. A method of manufacturing a semiconductor device as claimed in claim 1, wherein the region in which the metal silicide contact is formed is a gate region formed on the semiconductor substrate.

3. A method of manufacturing a semiconductor device as claimed in claim 1, wherein the region in which the metal silicide contact is formed is an active region formed in the surface of the semiconductor substrate.

4. A method of manufacturing a semiconductor device as claimed in claim 1, wherein the region in which the metal silicide contact is formed is a gate region formed on the semiconductor substrate and an active region formed in the surface of the semiconductor substrate.

5. A method of manufacturing a semiconductor device as claimed in claim 1, wherein the silicidation blocking layer is formed in such a manner that silicon oxynitride (SiON) is deposited at a temperature of less than 400 Celsius Degrees by a plasma-enhanced chemical vapor deposition process.

6. A method of manufacturing a semiconductor device as claimed in claim 5, wherein at the step of wet etching the silicidation blocking layer, an etchant is used so that the silicon oxynitride has an etch selectivity of no less than about 10:1 with respect to an oxide.

7. A method of manufacturing a semiconductor device comprising the steps of:
   forming transistors having gate electrode and source/drain regions on an active region of a semiconductor substrate;
   forming a silicidation blocking layer on the transistors and the semiconductor substrate by a plasma-enhanced chemical vapor deposition process;
   removing the silicidation blocking layer from a partial region of the semiconductor substrate by using only a wet etching process with an etchant that includes hydrogen fluoride and hydrogen peroxide to form a silicidation blocking layer pattern;
   forming a metal layer on the silicidation blocking layer pattern, the transistors and the semiconductor substrate; and
   inducing a silicide reaction of silicon in the partial region of the semiconductor substrate, in which the silicidation blocking layer pattern is not formed, and of metal in the metal layer to form a metal silicide.

8. A method of manufacturing a semiconductor device as claimed in claim 7, wherein the partial region of the semiconductor substrate is the gate region of the transistors.

9. A method of manufacturing a semiconductor device as claimed in claim 7, wherein the partial region of the semiconductor substrate is the source/drain regions of the transistors.

10. A method of manufacturing a semiconductor device as claimed in claim 7, wherein the partial region of the semiconductor substrate is the gate region and the source/drain regions of the transistors.

11. A method of manufacturing a semiconductor device as claimed in claim 7, wherein the silicidation blocking layer is formed in such a manner that silicon oxynitride (SiON) is deposited at a temperature of less than 400 Celsius Degrees by the plasma-enhanced chemical vapor deposition process.

12. A method of manufacturing a semiconductor device as claimed in claim 11, wherein at the step of wet etching the silicidation blocking layer, an etchant is used so that the silicon oxynitride has an etch selectivity of no less than about 10:1 with respect to an oxide.

13. A method of manufacturing a semiconductor device as claimed in claim 7, wherein the step of forming the silicidation blocking layer pattern includes:
   forming an etching mask on the silicidation blocking layer in order to open the partial region of the semiconductor substrate;
   removing the silicidation blocking layer in the partial region of the semiconductor substrate by the wet etching process using the etching mask; and
   removing the etching mask.

14. A method of manufacturing a semiconductor device as claimed in claim 13, wherein the etching mask is a photoresist pattern.

15. A method of manufacturing a semiconductor device comprising the steps of:
   forming transistors having gate electrode and source/drain regions on an active region of a semiconductor substrate;
   forming a silicidation blocking layer on the transistors and the semiconductor substrate by a plasma-enhanced chemical vapor deposition process;
   forming an etching mask on the silicidation blocking layer in order to open a partial region of the semiconductor substrate;
   removing the silicidation blocking layer in the partial region by a wet etching process using the etching mask and an etchant that includes hydrogen fluoride and hydrogen peroxide to form a silicidation blocking layer pattern;
   removing the etching mask;
   forming a metal layer on the silicidation blocking layer pattern, the transistors and the semiconductor substrate; and
   inducing a silicide reaction of silicon in the partial region of the semiconductor substrate, in which the silicidation blocking layer pattern is not formed, and of metal in the metal layer to form a metal silicide.

16. The method of claim 15, wherein forming the etching mask comprises forming a photoresist pattern.

* * * * *

UNITED STATES PATENT AND TRADEMARK OFFICE
CERTIFICATE OF CORRECTION

PATENT NO. : 6,861,369 B2
DATED : March 1, 2005
INVENTOR(S) : Park

It is certified that error appears in the above-identified patent and that said Letters Patent is hereby corrected as shown below:

Column 2,
Line 41, replace "cobalt suicides 26" with -- cobalt silicides 26 --.

Signed and Sealed this

Third Day of January, 2006

JON W. DUDAS
*Director of the United States Patent and Trademark Office*